United States Patent
Navarro (10) Patent No.: US 9,941,471 B2
(45) Date of Patent: Apr. 10, 2018

(54) METHOD OF MANUFACTURING A PCRAM MEMORY

(71) Applicant: COMMISSARIAT A L'ENERGIE ATOMIQUE ET AUX ENERGIES ALTERNATIVES, Paris (FR)

(72) Inventor: Gabriele Navarro, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/348,426

(22) Filed: Nov. 10, 2016

(65) Prior Publication Data
US 2017/0141307 A1    May 18, 2017

(30) Foreign Application Priority Data
Nov. 13, 2015  (FR) ..................... 15 60903

(51) Int. Cl.
*H01L 21/00* (2006.01)
*H01L 45/00* (2006.01)
*H01L 27/24* (2006.01)

(52) U.S. Cl.
CPC ...... *H01L 45/1608* (2013.01); *H01L 27/2463* (2013.01); *H01L 45/06* (2013.01);
(Continued)

(58) Field of Classification Search
CPC ... H01L 45/06; H01L 45/144; H01L 45/1233; H01L 27/2463; H01L 45/126;
(Continued)

(56) References Cited

U.S. PATENT DOCUMENTS 6,534,781 B2 * 3/2003 Dennison ............. H01L 29/685
257/5
9,397,145 B1 * 7/2016 Sills .................... H01L 27/2418
(Continued)

OTHER PUBLICATIONS

Search Report as issued in French Patent Application No. 1560903, dated Jul. 14, 2016.

*Primary Examiner* — Bradley K Smith
*Assistant Examiner* — David Goodwin
(74) *Attorney, Agent, or Firm* — Pillsbury Winthrop Shaw Pittman LLP (57) ABSTRACT

A method for manufacturing a PCRAM memory includes forming in a first dielectric layer arranged on a substrate, which includes bottom electrodes, a first rectilinear trench opening onto the set of electrodes; depositing a first active layer in the first trench, such that the first active layer is in electrical contact with the electrodes; covering the first active layer with a second dielectric layer; etching, in the second and second dielectric layers and the first active layer, additional rectilinear trenches oriented perpendicularly to the first trench, to obtain a group of memory devices each including a portion of the first active layer in electrical contact with one of the electrodes; filling the additional trenches with a sacrificial dielectric material; performing an anisotropic etching of the sacrificial material to expose a side surface of each portion of the first active layer; and covering the side surface with a second active layer.

9 Claims, 6 Drawing Sheets

(52) U.S. Cl.
CPC ........ *H01L 45/124* (2013.01); *H01L 45/1253* (2013.01); *H01L 45/144* (2013.01); *H01L 45/1683* (2013.01); *H01L 45/1691* (2013.01)

(58) Field of Classification Search
CPC ... H01L 45/16; H01L 45/1691; H01L 45/124; H01L 45/1683; H01L 45/1253; H01L 45/1666
See application file for complete search history.

(56) References Cited

U.S. PATENT DOCUMENTS

| | | | |
|---|---|---|---|
| 2006/0097341 A1* | 5/2006 | Pellizzer | H01L 45/1691 257/528 |
| 2007/0152205 A1 | 7/2007 | Chen | |
| 2010/0176365 A1* | 7/2010 | Park | H01L 45/124 257/3 |
| 2010/0190321 A1* | 7/2010 | Oh | C23C 16/32 438/478 |
| 2011/0237045 A1* | 9/2011 | Bez | G11C 11/5678 438/382 |
| 2011/0300685 A1* | 12/2011 | Horii | H01L 27/2409 438/382 |
| 2012/0217463 A1* | 8/2012 | Hwang | H01L 45/126 257/4 |
| 2012/0225533 A1* | 9/2012 | Kim | H01L 27/224 438/382 |
| 2012/0252187 A1* | 10/2012 | Oh | H01L 27/1021 438/430 |
| 2013/0256621 A1 | 10/2013 | Park et al. | |
| 2014/0198565 A1* | 7/2014 | Pellizzer | H01L 45/06 365/163 |

* cited by examiner

METHOD OF MANUFACTURING A PCRAM MEMORY

CROSS-REFERENCE TO RELATED APPLICATIONS

This application claims priority to French Patent Application No. 1560903, filed Nov. 13, 2015, the entire content of which is incorporated herein by reference in its entirety.

TECHNICAL FIELD

The present invention relates to a method for manufacturing a Phase-Change Random Access Memory (PCRAM).

STATE OF THE ART

In a PCRAM memory each bit of information is stored in a cell or memory point comprising a phase change material, typically a chalcogenide material (e.g. GeTe, $Ge_2Sb_2Te_5$), positioned between a bottom electrode and a top electrode. A phase change material is capable of switching very rapidly and reversibly between an amorphous phase and a crystalline phase. The properties of these two phases differ greatly. The amorphous phase is characterised in particular by a high electrical resistivity, whereas the crystalline phase has a much lower electrical resistivity.

The information bit is therefore encoded by the difference of resistivity between the amorphous state and the crystalline state of the phase change material. Typically, the amorphous state represents the logical level '0' and the crystalline state represents the logical level '1'. Transition from the crystalline state to the amorphous state is obtained by applying a short pulse of high amplitude current to cause the crystalline material to melt locally, and to make it amorphous. Transition from the amorphous state to the crystalline state is also based on heating the material, at a crystallisation temperature which is however lower. It is obtained by applying a longer current pulse, but which is of lower amplitude.

PCRAM memories constitute one of the most promising technologies for the manufacture of the next generations of rewritable non-volatile memories. Indeed, they have high integration density and excellent information retention. They can also withstand a large number of write and erase cycles. However, one disadvantage of the existing PCRAM memory structures lies in their high electrical consumption.

To reduce the consumption of a PCRAM memory cell when it is programmed, it can be sought to reduce the heating area of the phase change material, i.e. the contact surface between the phase change material and the cell's electrodes. Indeed, this contact surface, which is also called the active surface, influences the electrical current consumed during programming. The most common technique thus consists in confining the phase change material in a small volume. In this case a PCRAM memory is said to be "confined".

In patent application US2013/0256621, for example, the phase change material is deposited above the bottom electrode in a gap of nanometric dimensions.

Figure 1:
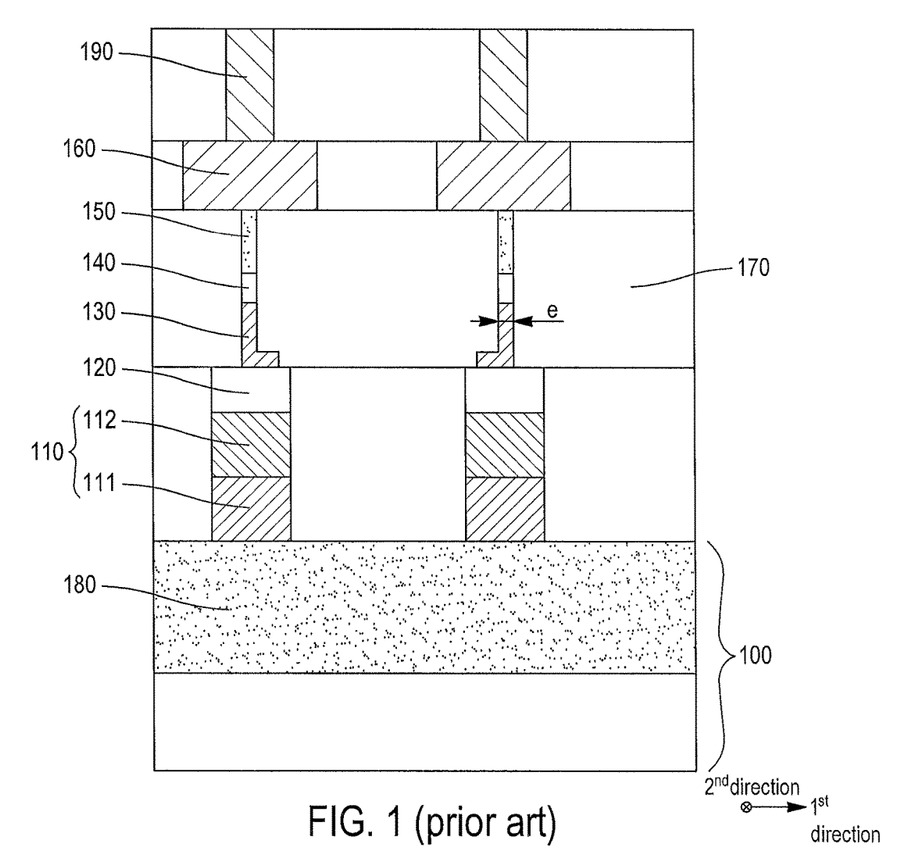
FIGS. 1 and 2, described above, are section views of PCRAM memories manufactured according to methods of the prior art.

FIG. 1 shows a section view of the PCRAM memory described in document US2013/0256621. PCRAM memory conventionally has a plurality of memory cells formed on a planar substrate 100 made of a semiconductor material. The memory cells are arranged in rows and columns on substrate 100, in the form of a matrix. Only two cells of a row are represented in FIG. 1.

Each memory cell successively comprises a diode 110 consisting of an N-type doped area 111 in contact with a P-type doped area 112, a contact pad 120 made of metal silicide, an L-shaped bottom electrode 130, a heating element 140, a phase change material 150, and a top electrode 160.

On the side of substrate 100, diode 110 of each memory cell is connected to a first electrically conductive track 180 formed in the substrate. First conductive track 180, which extends in a first direction parallel to the plane of substrate 100, connects diodes 110 of the memory cells belonging to a given row. It acts as a word-line for addressing the cells of the PCRAM memory. On the side opposite substrate 100, top electrode 160 is connected to a second electrically conductive track 190. This second conductive track 190 extends parallel to substrate 100 in a second direction perpendicular to the first direction. Second conductive track 190 forms a bit-line which connects top electrodes 160 of the memory cells belonging to a given column.

The method for manufacturing such a confined PCRAM memory structure comprises the formation of a trench in a layer of dielectric material 170 deposited on contact pads 120, deposition of a metal layer in a conforming manner at the bottom and against the sides of the trench, followed by etching of the metal between contact pads 120 to delimit in the first direction bottom electrodes 130 of the memory cells. The metal of electrodes 130 is then etched partially to form gaps in dielectric layer 170. The conductive material of heating elements 140 and phase change material 150 are then deposited in these gaps, before the memory cells are delimited by photolithography in the second direction (i.e. in the direction normal to the plane of FIG. 1).

In this memory cell configuration the dimensions of the active surface are therefore given by thickness e of the metal layer forming bottom electrodes 130, and by the photolithography pitch in the second direction (i.e. the space between two consecutive rows of memory cells). Reduction of the active surface must thus contend with the limits of photolithography, particularly in terms of critical dimension.

Patent application US2007/0152205 describes another PCRAM memory manufacturing method enabling the phase change material to be confined, in which the active surface of each memory cell is not delimited by a step of photolithography. This technique is based on the formation of spacers made from phase change material.

Figure 2:
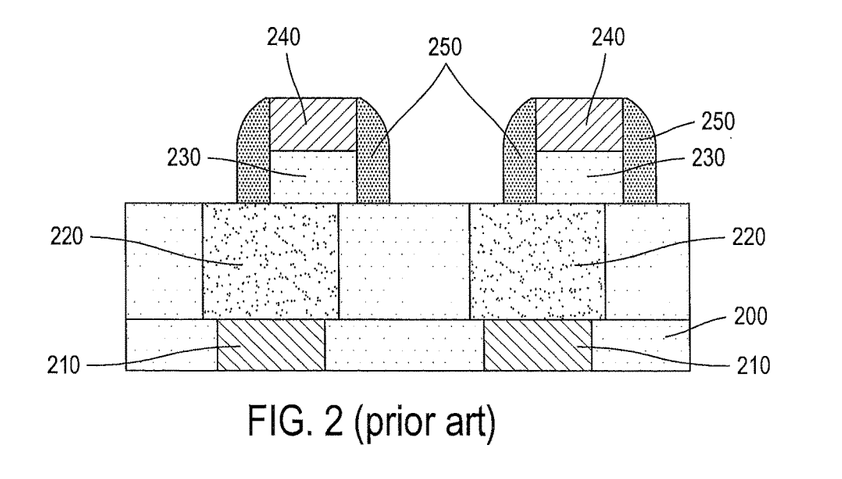

FIG. 2 is a section view of two memory cells formed on a semiconductor substrate 200 using this manufacturing method. Each memory cell comprises a bottom electrode 210 formed in substrate 200 and a heating element 220 (called a "thermal electrode" in the document) in contact with bottom electrode 210. When seen from above (not represented), heating element 220 is ring-shaped. A dielectric layer 230 covers a portion of this ring, and an top electrode 240 is deposited on dielectric layer 230. Finally, two spacers 215 made of phase change material are created either side of dielectric layer 230 surmounted by top electrode 240.

The active surface of the memory cell is in this case equal to the area of ring-shaped heating element 220 covered by one of spacers 250 (the one to the left in FIG. 2). It is equal to the thickness of the ring multiplied by the width of spacer 250.

This method for manufacturing PCRAM memory cell does not allow precise control of the active surface, and therefore of the cell's programming current, since it is difficult to control the shape and dimensions of the foot of spacer 250. Indeed, the techniques enabling small-dimension spacers to be obtained are not fully mastered. Consequently the performance of memory cells varies significantly from one cell to the next.

SUMMARY OF THE INVENTION

There is therefore a need to obtain a method for manufacturing a phase change memory (PCRAM) enabling precise control of the active surface of the memory cells, in order to reduce their programming current significantly.

According to the invention, this need tends to be satisfied by using a manufacturing method comprising the following steps:

providing a substrate including a set of bottom electrodes;

forming in a first dielectric layer positioned on the substrate a first rectilinear trench oriented in a first direction, and opening at least partially on to the set of bottom electrodes;

depositing a first active layer in the first rectilinear trench, such that the first active layer is brought in electrical contact with the set of bottom electrodes;

covering the first active layer with a second dielectric layer;

etching, in the second dielectric layer, the first active layer and the first dielectric layer, additional rectilinear trenches oriented in a second direction perpendicular to the first direction, so as to obtain a group of memory devices each comprising a portion of the first active layer in electrical contact with one of the bottom electrodes;

filling the additional rectilinear trenches with a sacrificial dielectric material;

performing an anisotropic etching of the sacrificial dielectric material so as to expose a side surface of each portion of the first active layer; and covering the side surface of each portion of the first active layer with a second active layer.

The first and second active layers are comprised of materials chosen from among the phase change material and an electrically conductive material. In other words, one of the first and second active layers acts as an electrode, whereas the other of these layers, comprised of the phase change material, performs the memorisation function.

The term "active surface" is applied to the contact surface between the first active layer and the second active layer of each device or memory cell. This is the smallest of the contact surfaces between the phase change material layer and the electrodes. This contact surface limits the electrical current consumed when programming the memory cell: the smaller it is, the lower is the programming current.

Etching of a material is said to be anisotropic when the etching speed varies according to the direction in which the material is etched. An anisotropic etching thus has a preferential direction in which the material is etched more rapidly.

In this manufacturing method, the active surface is delimited due to the step of anisotropic etching of the sacrificial dielectric material filling the additional rectilinear trenches. After the first active layer has been "divided" into several portions, or slices, during realisation of the additional rectilinear trenches, the anisotropic etching of the sacrificial dielectric material enables a lateral surface of each portion of the first active layer to be revealed, in order to deposit the second active layer on it. The active surface is thus defined by the thickness of the first active layer (measured in the second direction), and by the etching depth, the latter depending on the etching conditions, in particular the etching time and/or the preferential direction in which the dielectric material is etched.

Delimiting the active surface by etching, rather than by photolithography or the formation of spacers, allows more precise dimensional control of this surface. By this means it is possible to reduce the performance disparities between the different cells of the memory. The first active layer is also less impacted by etching on the side than by etching or by chemical mechanical polishing of the upper face. This produces a higher quality electrical contact.

In a preferential embodiment, the first active layer is comprised of a phase change material and the second active layer is comprised of an electrically conductive material to form a top electrode. The PCRAM memory can then be qualified as "confined", since the phase change material is contained in the first rectilinear trench. The contact surface is, in this embodiment, limited by the portion of phase change material exposed during the anisotropic etching.

Conversely, in an alternative embodiment, the first active layer is comprised of an electrically conductive material to form an additional electrode, called a "thermal electrode", and the second active layer is comprised of the phase change material. The corresponding PCRAM memory structure can be qualified as "planar", since the phase change material is deposited on the exposed surface of the thermal electrode. The active surface is then limited by the thermal electrode located in the first rectilinear trench, rather than by the phase change material layer.

In another alternative embodiment, the first active layer and the second active layer are comprised of a phase change material and the second active layer is further covered by a layer made of an electrically conductive material to form a top electrode.

The anisotropic etching of the sacrificial dielectric material can be accomplished in a preferential direction perpendicular to the substrate, through a mask comprising a plurality of recesses and, in each recess, vertical sides.

Alternatively, the anisotropic etching of the sacrificial dielectric material is accomplished in a preferential direction perpendicular to the substrate, through a mask comprising a plurality of recesses and, in each recess, oblique sides.

The first active layer is preferably deposited in a conforming manner on the bottom and against the sides of the first rectilinear trench, where one of the sides overhangs the set of the bottom electrodes. The first active layer is thus thin, while the dimensions of the first trench are compatible with usual photolithography techniques. The active surface of the memory cell is substantially reduced thereby. After such a deposition of the first active layer, the first rectilinear trench is advantageously filled with at least one electrically insulating encapsulation material. The second dielectric layer is then deposited on the first dielectric layer, on the first active layer and on the encapsulation material.

Alternatively, the first active layer is deposited such that it fills completely the first rectilinear trench formed in the first dielectric layer. The second dielectric layer is then deposited on the first dielectric layer and on the first active layer.

BRIEF DESCRIPTION OF THE FIGURES

Other characteristics and advantages of the invention will become clear from the description which is given of it below, by way of example and non-restrictively, with reference to the appended figures, in which.

For greater clarity, identical or similar elements are identified by identical reference signs in all the figures.

DETAILED DESCRIPTION OF AT LEAST ONE EMBODIMENT

Figure 3:
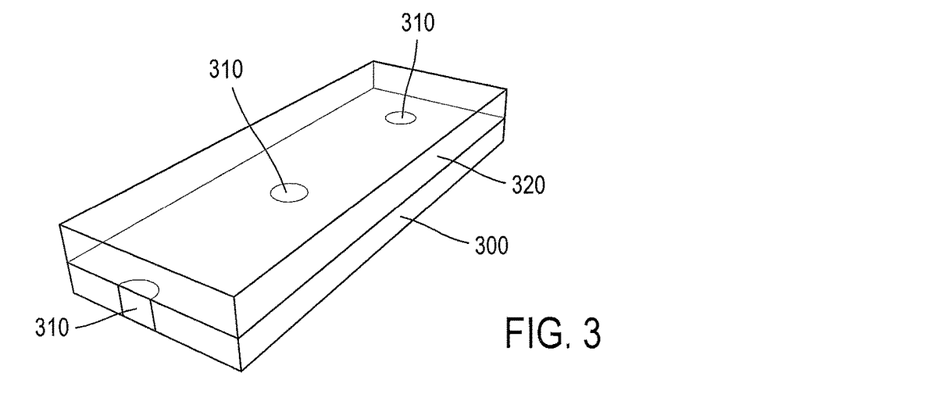
FIG. 3 shows a perspective view of an initial substrate on which a PCRAM memory can be manufactured, using a manufacturing method according to the invention.

A preferential embodiment of the method for manufacturing PCRAM memory according to the invention will now be described with reference to FIGS. 3, 4A to 4I. FIG. 3 shows a perspective view of a flat substrate 300 used as the starting point for the manufacturing method, whereas FIGS. 4A to 4I illustrate successive steps F1 to F9 of the manufacturing method.

The purpose of this method is to form multiple PCRAM-type memory cells on substrate 300. These memory cells are preferably positioned in rows and columns on the surface of substrate 300, in the form of a matrix. For the sake of clarity FIGS. 3 and 4A to 4I show only a portion of substrate 300 corresponding to a column of the memory matrix.

Substrate 300 advantageously comprises a CMOS circuit capable of addressing each memory cell, and of reading the data recorded in the memory cell, i.e. the electrical resistance value of the phase change material. This circuit comprises, for example, transistors connected electrically to the memory cells by one or more interconnection levels. In FIG. 3 only the last level of interconnection before the memory cells has been represented. It is formed from a layer made of dielectric material (for example $Si_3N_4$, $SiO_2$ or $Al_2O_3$) traversed by interconnection patterns 310, such as conducting via or conductive tracks, typically made of metal (copper, aluminium, etc.).

Interconnection patterns 310, of which there may for example be 3, as in FIG. 3, form the bottom electrodes of the memory cells. These bottom electrodes 310, for example in the form of cylindrical pads, are advantageously aligned in a first direction, in this case the direction of the columns of the memory matrix. Each bottom electrode 310 belongs to a memory cell of the column. The distance between two consecutive bottom electrodes 310 thus defines the pitch of the memory cells in the column. It generally depends on the separation between the transistors of the addressing circuit.

Substrate 300 containing bottom electrodes 310 is covered with a first dielectric layer 320, for example made of silicon nitride ($Si_3N_4$). In this preferential embodiment, the thickness of dielectric layer 320 determines the height of the active layer made of phase change material. It is preferably between 50 nm and 300 nm.

Figure 4A:
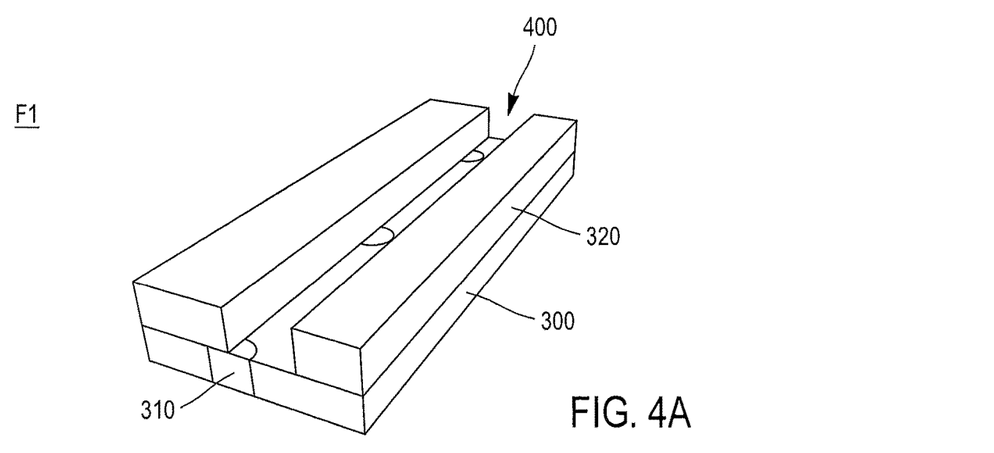
FIGS. 4A to 4I are perspective views of the substrate in the course of the steps of manufacture of the PCRAM memory, according to a preferential embodiment of the method according to the invention.

Step F1 represented in FIG. 4A consists in forming a first rectilinear trench 400 in first dielectric layer 320. Trench 400 is oriented in the first direction and opens on to bottom electrodes 310 of the column of memory cells. At least one portion of the upper face of each electrode 310 is exposed after trench 400 is formed. Trench 400 is, for example, obtained by a photolithography operation, followed by an operation of etching of first dielectric layer 320.

In this preferential embodiment of the method, it is desired to manufacture a PCRAM memory of the confined type. One of the sides of trench 400 overhangs bottom electrodes 310. This side is intended to be covered with a thin layer of phase change material, called below "PCM" (Phase Change Material).

Figure 4B:
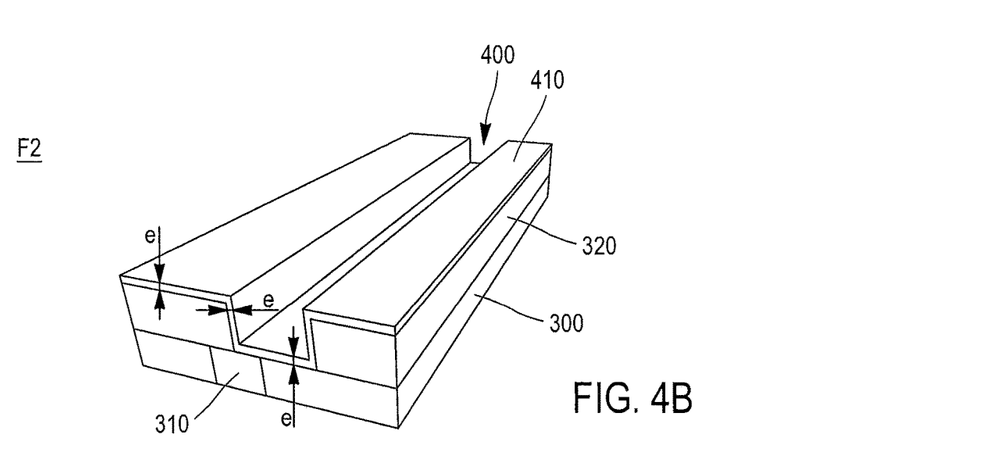

Thus, in step F2 of FIG. 4B, a PCM layer 410 is deposited on the bottom and against the sides of trench 400. A contact is then made between PCM layer 410 and bottom electrodes 310 of substrate 300 located vertically under one of the two sides. PCM layer 410 is preferably deposited in a conforming manner over the entire surface of substrate 300 covered with dielectric layer 320, for example by physical vapour deposition (PVD), chemical vapour deposition (CVD) or atomic layer disposition (ALD). Thickness e of PCM layer 410 is thus constant whatever the orientation of the surface on which it has been deposited. This thickness e is preferably between 2 nm and 20 nm.

Figure 4C:
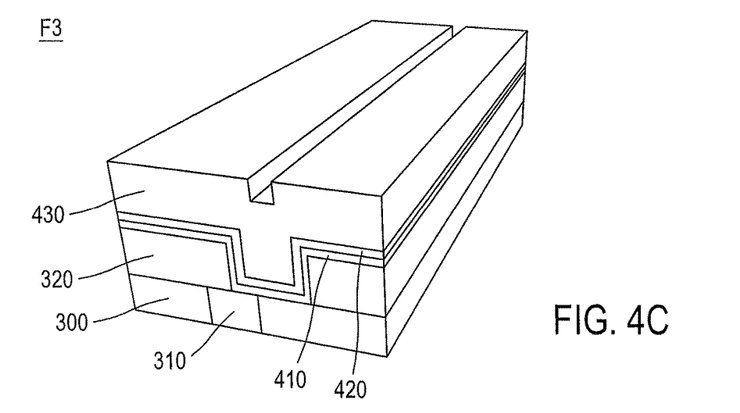
Figure 4D:
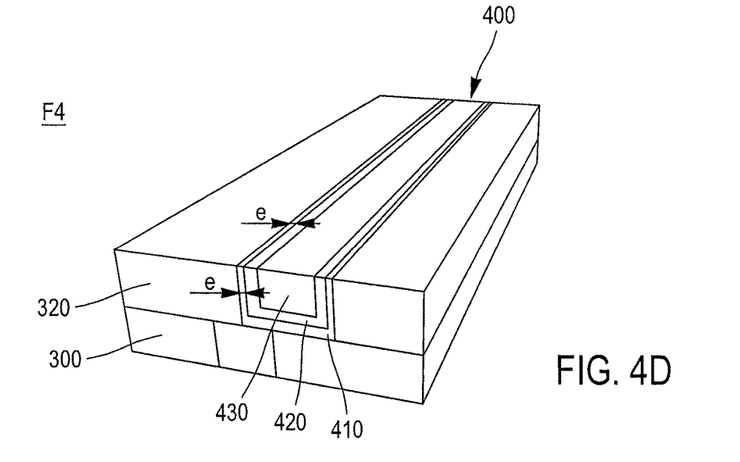
Figure 4E:
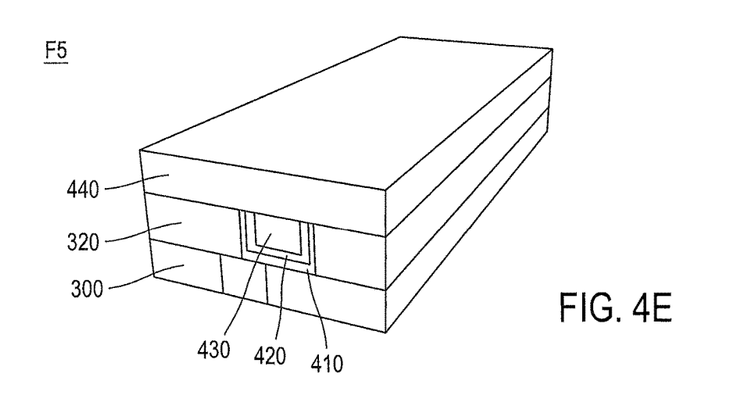

Steps F3 to F5, represented by FIGS. 4C to 4E respectively, enable the phase change material to be encapsulated, to protect it from oxidisation.

In step F3 (FIG. 4C), a barrier layer 420 made of dielectric material, for example $Si_3N_4$ or $Ge_3N_4$, is deposited on PCM layer 410. A planarising layer 430, also made of dielectric material (for example $SiO_2$), is then deposited on barrier layer 420 so as to fill trench 400 completely. These successive depositions of dielectric materials are, preferably, accomplished in a conforming manner, like the deposition of the phase change material. Barrier layer 420 is thin compared to that of planarising layer 430 and to the width of trench 400, and is preferably between 20 nm and 50 nm.

Barrier layer 420 blocks the diffusion of oxygen atoms towards layer of PCM 410. These oxygen atoms can, in particular, originate from planarising layer 430 made of $SiO_2$. Nitride barrier layer 420 can also be used to for thermal insulation of the phase change material.

Step F4 comprises a chemical mechanical polishing (CMP) operation and/or an etching operation in order to remove the materials outside trench 400 (FIG. 4D). In particular, portions of layers 410, 420 and 430 located above first dielectric layer 320 are eliminated. First dielectric layer 320 advantageously acts as a stop layer during the CMP or etching operation. After this step F4, a flat surface comprised of dielectric materials (mainly the material of first dielectric layer 320) and of two thin phase change material lamellae is obtained. These two PCM lamellae locate the two sides of rectilinear trench 400, and their width is equal to thickness e of PCM layer 410. As a comparison, the width of trench 400 can be between 50 nm and 200 nm.

In F5 (FIG. 4E), a second dielectric layer 440 is deposited on this flat surface. Second dielectric layer 440 thus covers first dielectric layer 320, PCM layer 410 (i.e. both lamellae), barrier layer 420 and planarising layer 430. It is advantageously comprised of a nitride, for example $Si_3N_4$, and can be between 10 nm and 30 nm thick. The deposition of second dielectric layer 440 finalises the encapsulation of PCM layer 410, which is now entirely surrounded by dielectric materials except, of course, for bottom electrodes 310, which are located at the surface of substrate 300. The phase change material is therefore completely protected from oxidisation.

Figure 4F:
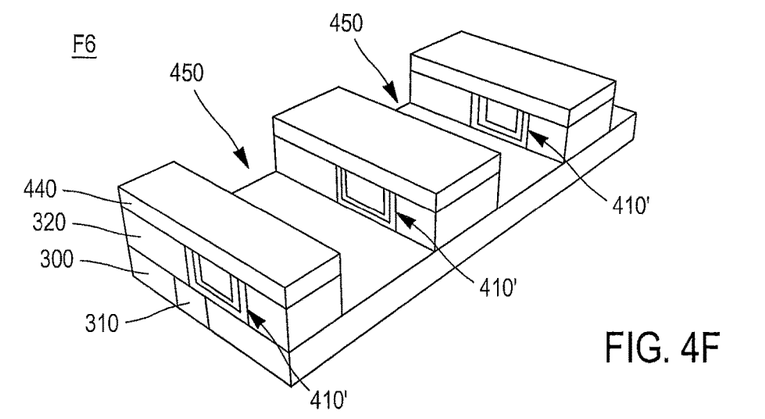

In step F6 of FIG. 4F, a plurality of additional trenches 450 is formed through second dielectric layer 440, and first dielectric layer 320, preferably up to substrate 300. These second trenches 450, which are also rectilinear, extend in a second direction perpendicular to the first direction, in other words in the direction of the rows of the memory matrix.

For example, additional trenches 550 are obtained by producing a hard mask (not represented) on the surface of second dielectric layer 440, and thanks to an anisotropic etching operation (for example a RIE etching) through the hard mask. Second dielectric layer 440 protects PCM layer 410 when the hard mask is produced, for example by photolithography and etching. By this means the top of PCM layer 410 is not affected when additional trenches 450 are formed.

On the other hand, the formation of additional trenches 450 has the effect of dividing PCM layer 410 lengthwise into several portions or "slices" 410' (since anisotropic etching is not selective relating to the phase change material). Each slice 410' of PCM layer, in electrical contact with a bottom electrode 310, belongs to a memory cell of the column and fulfils the memorisation function of this cell. The formation of trenches 450 thus delimits the different memory cells of the column (of which there are 3 in the example of FIG. 4F), and more widely the rows of the memory matrix.

Figure 4G:
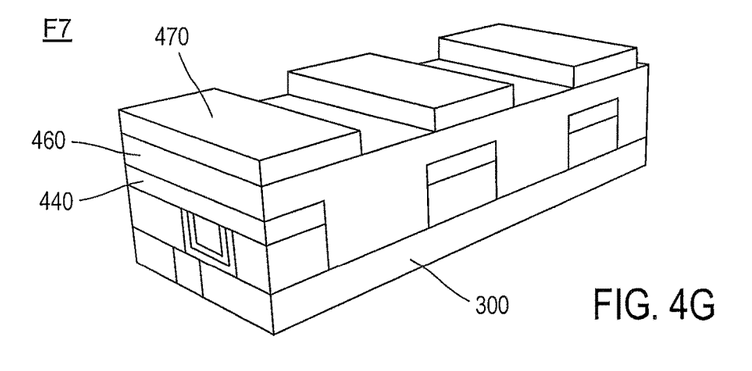

In F7 (FIG. 4G), a sacrificial dielectric material 460, for example $SiO_2$, is deposited on substrate 300, to fill additional trenches 450. This dielectric material is said to be "sacrificial" since it will subsequently be etched to reach slices 410' of the PCM layer. As illustrated in FIG. 4G, sacrificial dielectric material 460 can be deposited in such a way that it overflows trenches 450 on to second dielectric layer 440, for example by CVD. After this, a step of chemical mechanical polishing (CMP) is accomplished. This enables a layer made of sacrificial dielectric material 460 with a flat surface to be obtained. The surplus thickness of sacrificial material 460 on second dielectric layer 440 can be between 50 nm and 100 nm.

An etching mask 470 is then formed on the surface of layer 460 of sacrificial dielectric material. Etching mask 470 comprises several recesses delimiting the etching areas. In this preferential embodiment, the sides of mask 470 in each recess are vertical, i.e. perpendicular to substrate 300. Etching mask 470 can be a hard mask made of $SiO_2$, obtained by photolithography followed by etching, or can be formed from a resin layer.

Figure 4H:
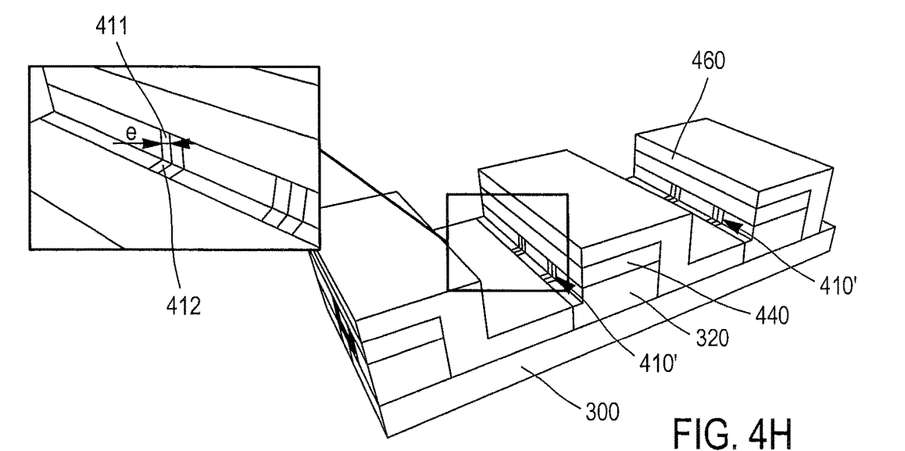

In step F8 of FIG. 4H, sacrificial dielectric material 460 deposited in additional trenches 450 is etched anisotropically through mask 470, in order to release a lateral face of each slice 410'. Since it is located in additional trenches 450, the lateral surface of slices 410' exposed by etching of sacrificial material 460 extends in the second direction over the entire thickness e of the PCM layer.

This anisotropic etching is preferably a fluorine-based plasma etching (e.g. $C_xF_y$), which is dry and non-selective relative to mask 470, for example of the RIE type. It can be produced in the presence of a gas (e.g. Ar, $O_2$, He) to make the plasma less reactive, increasing by this means the physical aspect of the etching. The etching speed can be equal to 1 nm/s, even with a power level of between 800 W and 1500 W (the range habitually used for etching dielectric materials).

The anisotropic etching is accomplished, in the example of FIG. 4H, in a preferential direction perpendicular to the plane of substrate 300. As is represented in a close-up view (cf. the insert of FIG. 4H), the exposed surface of each slice 410' then comprises a vertical portion 411 (i.e. which extends perpendicularly to the plane of substrate 300) and, possibly, a horizontal portion 412 (i.e. which extends in parallel to the plane of substrate 300). The widths of portions 411 and 412, measured in the second direction, are equal to thickness e of PCM layer 410. The length of vertical portion 411, measured perpendicularly to the plane of substrate 300, depends on the depth of the anisotropic etching, i.e. on the etching time (for a given etching speed).

The possible presence of horizontal portion 412, and its area, depend on the alignment of etching mask 470 relative to the edge of additional trenches 450 of FIG. 4F. Indeed, when the edges of the recesses of mask 470 are perfectly aligned with the edges of trenches 450, only vertical portions 411 of slices 410' are revealed. However, since such an alignment is difficult to accomplish, and in order nevertheless to guarantee access to the phase change material, it is preferable to offset the mask's recesses slightly towards the interior of slices 410'. A portion of slice 410' of PCM is then etched, together with a portion of first dielectric layer 320 and of second dielectric layer 440. The value of the misalignment between etching mask 470 and additional trenches 450 determines the length of horizontal portion 412.

The etching method used can etch the phase change material more rapidly than the dielectric materials in the preferential direction. Thus, the anisotropic etching of the phase change material can extend vertically up to substrate 300, in which case there will no longer be any horizontal portion 412. This is not problematic, since vertical portion 411 is a preferential area for making electrical contact with the phase change material.

For example, if thickness e of phase change material layer 410 is 5 nm and first dielectric layer 320 is etched over a depth of 10 nm, an active surface of 50 $nm^2$ is obtained, much smaller than in the methods of the prior art.

Figure 4I:
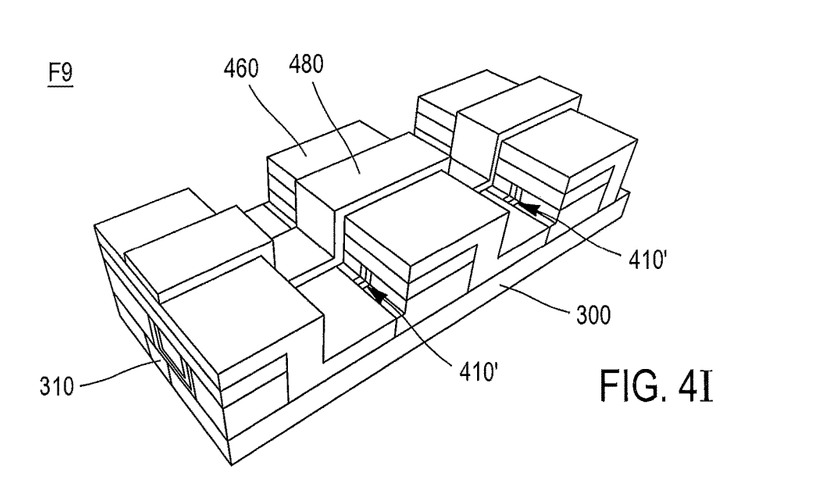

In step F9 of FIG. 4I, a top electrode 480 is deposited on the exposed surfaces of PCM slices 410', for example by PVD. Top electrode 480 can be formed from one or more layers of electrically conductive material. Metallic materials, such as Ti, TiN, Ta and TaN, guarantee satisfactory electrical contact with the PCM layer. As with bottom electrode 310 and the PCM layer, top electrode 480 forms an electrically active layer of the memory cells. Top electrode 480 preferably has the shape of a conductive track which extends continuously in the first direction, closely following the relief created by the etching of sacrificial material 460. Advantageously, a single top electrode 480 is used to connect the different memory cells of the column, thus forming a bit line for addressing of these memory cells.

At the end of step F9, a final layer of dielectric material is advantageously deposited on the substrate, so as to cover fully top electrode 480, and to obtain a flat upper face, and then electrical contacts opening on to top electrode 480 are formed in the dielectric layer.

Thus, in the preferential embodiment of FIGS. 4A-4I, the active surface of each memory cell is the contact surface between slice 410' of the PCM layer and top electrode 480. The transition between the crystalline and amorphous states of the phase change material preferentially occurs at this interface, since the current density is highest at this point.

Figure 5:
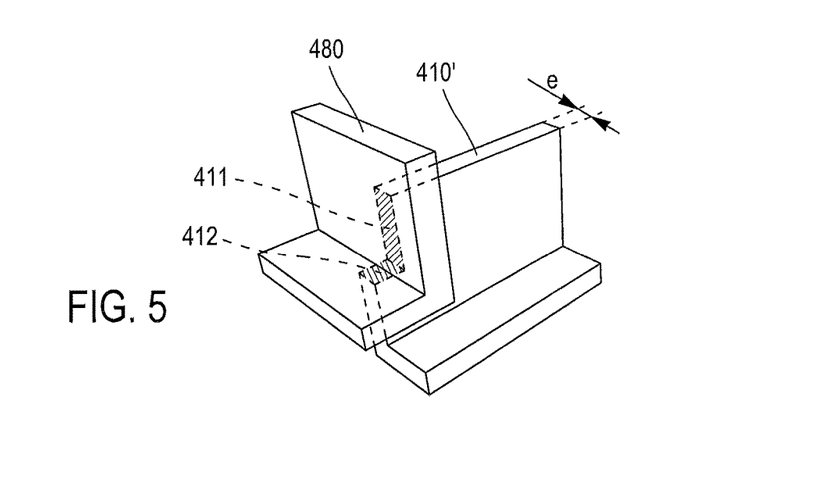
FIG. 5 is a close-up schematic view of the contact established between the first active layer and the second active layer during the step of FIG. 4I.

FIG. 5 is a schematic view of the contact surface between slice 410' of the PCM layer and top electrode 480. As previously described, it comprises a vertical portion 411 corresponding to a lateral face of PCM slice 410' and, if applicable, a horizontal portion 412. The dimensions of the active surface are small due to the fact the electrical contact is made on the slice of PCM layer 410. One of the dimensions of lateral portion 411 is fixed, and equal to thickness e of PCM layer 410. The other dimension varies according to the depth of the anisotropic etching.

Figure 6G:
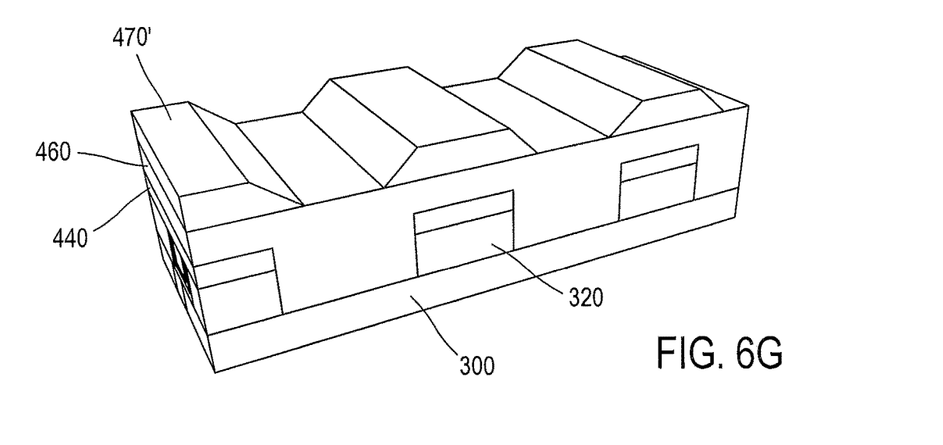
FIGS. 6G to 6I are perspective views of the substrate in a variant embodiment of the steps corresponding to FIGS. 4G to 4I.
Figure 6H:
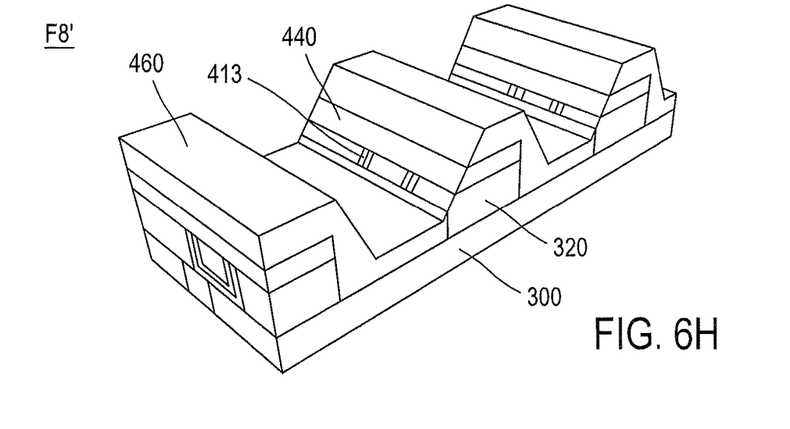
Figure 6I:
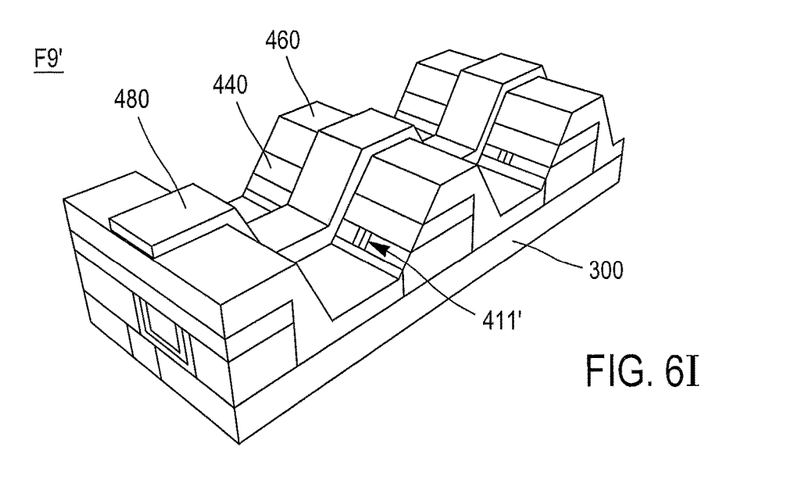

FIGS. 6G to 6I represent, from step F7 in which trenches 450 are filled with sacrificial dielectric material 460, an alternative embodiment of the manufacturing method.

FIG. 6G shows another configuration 470' of the etching mask formed on layer of sacrificial material 460. In this case etching mask 470' has oblique sides opposite one another in each recess. One of the oblique sides is located vertically under the lateral surface of the phase change material which it is desired to reveal. Etching mask 470' with the oblique sides is advantageously obtained by a lithography step using a resin flow.

FIG. 6H represents a variant F8' of the step of anisotropic etching of sacrificial material 460, enabling the phase change material to be revealed. The anisotropic etching is, in this case, accomplished through etching mask 470 with oblique sides of FIG. 6G. The anisotropic etching method can be identical to the one described in relation with FIG. 4H, retaining in particular the non-selective character, and a preferential direction perpendicular to the substrate. The effect of this is to etch not only sacrificial dielectric material 460 deposited in trenches 450, but also a portion of phase change material layer 410 and of dielectric layers 320 and 440. All these layers have an oblique side after the anisotropic etching, since the imprint of mask 470 is transferred into the substrate. An oblique lateral surface 413 of PCM slice 410' is exposed in this manner. Lateral surface 413 is preferably inclined relative to the normal to the substrate by an angle of between 25° and 65°.

The advantage of this solution is that lateral surface 413 of the phase change material is thus exposed for less time to the etching chemistry, compared to the embodiment of FIG. 4H, in which the surface of the phase change material (vertical portion 411) is exposed for the entire duration of the etching (after dielectric layer 320 starts being etched). In addition, the inclined profile created by the anisotropic etching through the mask with the oblique sides facilitates the making of new contacts on the active surface, in particular during the deposition of top electrode 480.

Step F9' represented by FIG. 6I is thus a variant of the step of deposition of top electrode 480 on the phase change material. Top electrode 480 is deposited on the oblique side of PCM slice 410', for example in the same way as indicated above in relation with FIG. 5I.

Figure 7:
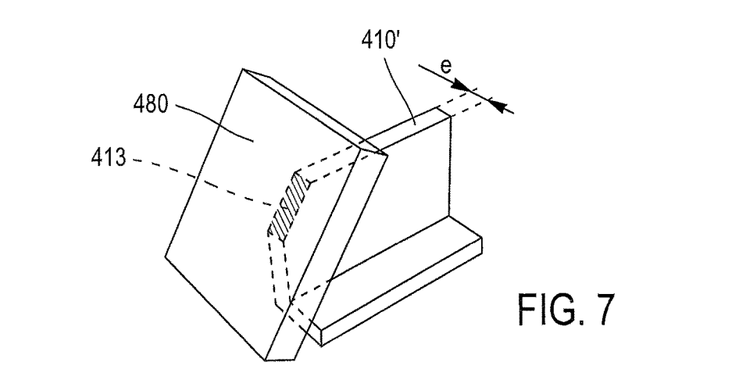
FIG. 7 is a close-up schematic view of the contact established between the first active layer and the second active layer during the step of FIG. 6I.

As can be seen in the close-up in FIG. 7, the lateral active surface consists in this case of a single oblique face 413. One of the dimensions of oblique face 413 is fixed, and is equal to thickness e of PCM layer 410. The other dimension varies according to the depth of the anisotropic etching and the angle of inclination of the anisotropic etching, i.e. the angle formed between the preferential direction of the etching and the normal to the substrate.

In an alternative embodiment of the manufacturing method (not represented in the figures), PCM layer 410 can occupy the entire volume of first rectilinear trench 400, rather than being limited to the bottom and sides of the trench, as is illustrated in FIG. 4B. This greatly simplifies the step of encapsulation of the phase change material, since it is then sufficient to deposit second dielectric layer 440 on first dielectric layer 320 and on PCM layer 410 (cf. FIG. 4E). However, the active surface is enlarged, since thickness e of PCM layer 410 is greater (cf. FIG. 5). Consequently, the memory cells' programming current will be higher in this alternative embodiment than in the embodiment of FIGS. 4A-4I and 5.

In all the PCRAM memory structures described above, first active layer 410 deposited in first rectilinear trench 400 is comprised of a phase change material, and second active layer 470, deposited on the first active layer, forms the top electrode. The phase change material of each memory cell is thus confined in trench 400 and isolated from that of the adjacent cells by dielectric material, the effect of which is to reduce still further the programming current (since the thermal dissipation is slowed). These PCRAM memory structures are called "confined" structures, since the phase change material is confined in trench 400.

The manufacturing method according to the invention is not, however, restricted to the production of confined PCRAM memory structures. Indeed, the same sequence of steps can be used to manufacture PCRAM memories with a planar structure.

To manufacture a PCRAM memory with a planar structure, it is possible in particular to reverse the nature of the materials forming first active layer 410 and second active layer 470. An electrically conductive material, for example TiN, W, WSi or TaN, is thus deposited in first rectilinear trench 400 to form a thermal electrode 410 above bottom electrode 310. The purpose of this electrode is to conduct the electrical current up to the phase change material, and to heat this material locally by the Joule effect. Its electrical resistivity is advantageously higher than that of bottom electrodes 310 made of copper or aluminium. PCM layer 470 is deposited on the exposed surface of thermal electrode 410 after anisotropic etching of the sacrificial dielectric material, as has been described in relation with FIG. 4H-4I or 5H-5I. This PCM layer 470 is then covered by a top electrode. The top electrode may have the same shape as phase change layer 470, for example a continuous strip extending in the first direction over several memory cells of the column. The layer of phase change material and the top electrode can also be delimited during the same photolithography step.

Another structure, halfway between the "confined" and "planar" structures, can be obtained by following the manufacturing method of FIG. 4A-4I (or 4A-4F, followed by 6G-6I), but by replacing, in step F9 of FIG. 4I (or F9', FIG. 6I), top electrode 480 by a two-layered stack consisting of an additional layer of PCM and of a layer made of a conductive material acting as a top electrode. By this means a first layer of PCM 410 is obtained (deposited against the walls of first rectilinear trench 400) in contact with a second layer of PCM over a very small area. This structure enables a thermal confinement of the active surface to be obtained, since change materials are excellent thermal insulators. Due to this thermal confinement the memory cell's programming current is reduced still further. Indeed, the memory cell will require less energy to reach the crystallisation and melting temperatures of the change material since the thermal dissipation is low.

The manufacturing method described above is of course extending to the entire substrate 300, since all cells of the memory matrix are manufactured simultaneously. For each column of the matrix a rectilinear trench 400 will be formed as described in relation with FIG. 4A. Trenches 400 corresponding to the different columns will be made parallel to one another.

Other configurations of bottom and top electrodes than the ones described above can be envisaged. For example, bottom electrodes 310 of the memory cells can be given the shape of a conductive track extending in the second direction, forming a word line which connects all the memory cells belonging to a given row.

The invention claimed is:

1. A method for manufacturing a PCRAM memory, comprising:
   providing a substrate comprising a set of bottom electrodes;
   forming in a first dielectric layer arranged on the substrate a first rectilinear trench oriented in a first direction, and opening at least partially on to the set of bottom electrodes;
   depositing a first active layer in the first rectilinear trench, such that the first active layer is brought in electrical contact with the set of bottom electrodes;
   covering the first active layer with a second dielectric layer;
   etching, in the second dielectric layer, the first active layer and the first dielectric layer, additional rectilinear trenches oriented in a second direction perpendicular to the first direction, so as to obtain a group of memory devices each comprising a portion of the first active layer in electrical contact with one of the bottom electrodes;
   filling the additional rectilinear trenches with a sacrificial dielectric material;
   performing an anisotropic etching of the sacrificial dielectric material in the additional rectilinear trenches so as to expose a lateral surface of each portion of the first active layer; and
   covering the lateral surface of each portion of the first active layer with a second active layer.

2. The method according to claim 1, wherein the first active layer is comprised of a phase change material and wherein the second active layer is comprised of an electrically conductive material to form a top electrode.

3. The method according to claim 1, wherein the first active layer is comprised of an electrically conductive material to form a thermal electrode and wherein the second active layer is comprised of a phase change material.

4. The method according to claim 1, wherein the first active layer and the second active layer are comprised of a phase change material and wherein the second active layer is further covered with a layer of an electrically conductive material to form a top electrode.

5. The method according to claim 1, wherein the anisotropic etching of the sacrificial dielectric material is accomplished in a direction perpendicular to the substrate, through a mask comprising a plurality of recesses and, in each recess, vertical sides.

6. The method according to claim 1, wherein the anisotropic etching of the sacrificial dielectric material is accomplished in a direction perpendicular to the substrate, through a mask comprising a plurality of recesses and, in each recess, oblique sides.

7. The method according to claim 1, wherein the first active layer is deposited in a conforming manner on a bottom and against sides of the first rectilinear trench, where one of the sides overhangs the set of bottom electrodes.

8. The method according to claim 7, further comprising filling the first rectilinear trench with at least one electrically insulating encapsulation material, the second dielectric layer being deposited on the first dielectric layer, on the first active layer and on said at least one electrically insulating encapsulation material.

9. The method according to claim 1, wherein the first active layer is deposited so as to fill completely the first rectilinear trench, the second dielectric layer being deposited on the first dielectric layer and on the first active layer.

* * * * *